United States Patent [19]
Sugihara et al.

[11] Patent Number: 5,642,183
[45] Date of Patent: Jun. 24, 1997

[54] SPATIAL FILTER USED IN A REDUCTION-TYPE PROJECTION PRINTING APPARATUS

[75] Inventors: Takashi Sugihara, Nara; Takashi Fukushima, Nara-ken; Junkou Takagi, Kashihara, all of Japan

[73] Assignee: Sharp Kabushiki Kaisha, Osaka, Japan

[21] Appl. No.: 294,351

[22] Filed: Aug. 23, 1994

[30] Foreign Application Priority Data

Aug. 27, 1993 [JP] Japan ................................. 5-212500

[51] Int. Cl.⁶ .................. H01L 21/27; G03B 27/42; G03B 27/52
[52] U.S. Cl. ............................................ 355/71; 355/53
[58] Field of Search .................................. 355/53, 71

[56] References Cited

U.S. PATENT DOCUMENTS

| | | | |
|---|---|---|---|
| 5,316,896 | 5/1994 | Fukuda et al. | 430/322 |
| 5,323,208 | 6/1994 | Fukuda et al. | 355/53 |
| 5,329,333 | 7/1994 | Noguchi et al. | 355/53 |
| 5,329,336 | 7/1994 | Hirano et al. | 355/53 |
| 5,348,837 | 9/1994 | Fukuda et al. | 430/269 |
| 5,369,464 | 11/1994 | Kamon | 355/43 |
| 5,389,474 | 2/1995 | Iguchi et al. | 430/5 |
| 5,393,623 | 2/1995 | Kamon | 430/5 |
| 5,418,598 | 5/1995 | Fukuda et al. | 355/66 |
| 5,440,426 | 8/1995 | Sandstrom | 359/559 |

FOREIGN PATENT DOCUMENTS

| | | |
|---|---|---|
| 4303028 | 8/1993 | Germany. |
| 55-136483 | 4/1982 | Japan. |
| 60-206664 | 3/1987 | Japan. |
| 2-218030 | 4/1992 | Japan. |
| 4251913 | 9/1992 | Japan. |

OTHER PUBLICATIONS

MicroProcess '93 The 6th International MicroProcess Conference pp. 40–41, Jul., 1993.

Primary Examiner—Arthur T. Grimley
Assistant Examiner—David A. Lane

[57] ABSTRACT

A spatial filter used in a reduction-type projection printing apparatus includes a central region through which a light beam passes at transmittance of at most a prescribed value, a substantially transparent peripheral region which surrounds the central region, and a phase shifter for producing phase difference of 180° between light beams passing through the central region and the peripheral region.

12 Claims, 14 Drawing Sheets

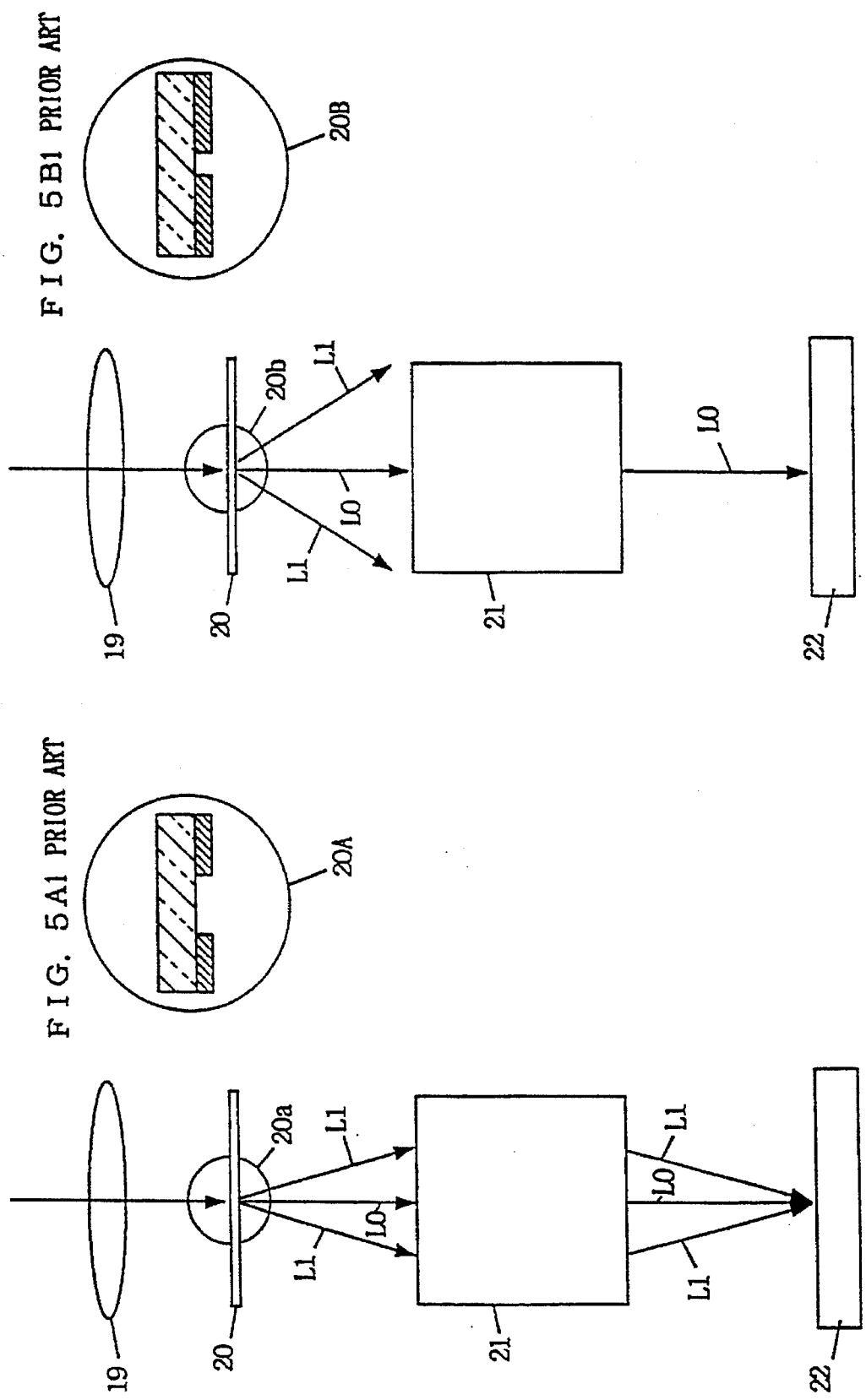

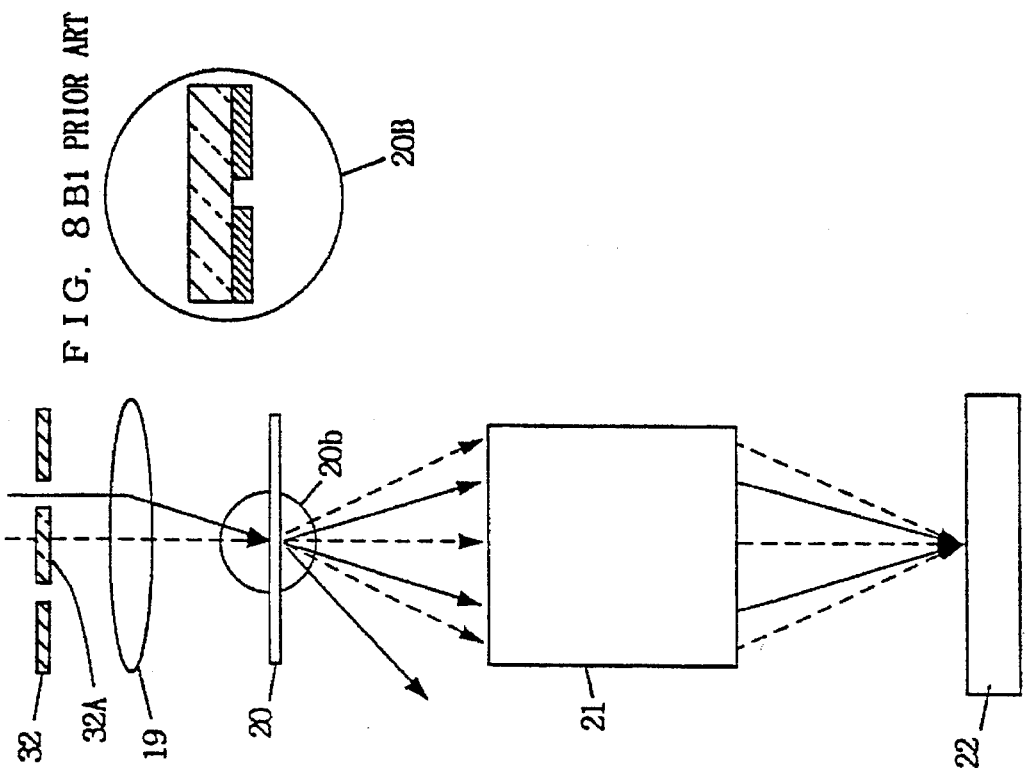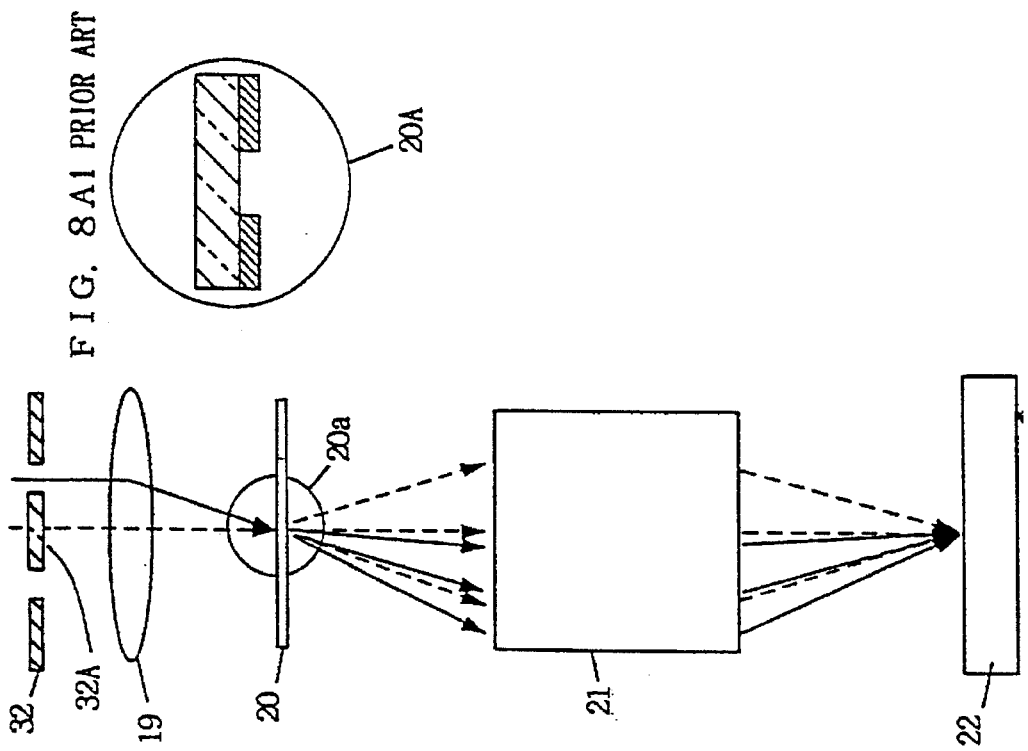

F I G. 1 2(A)
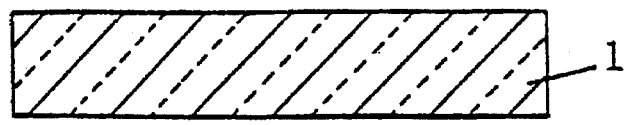
F I G. 1 2(B)
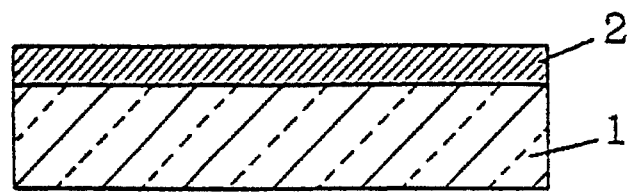
F I G. 1 2(C)
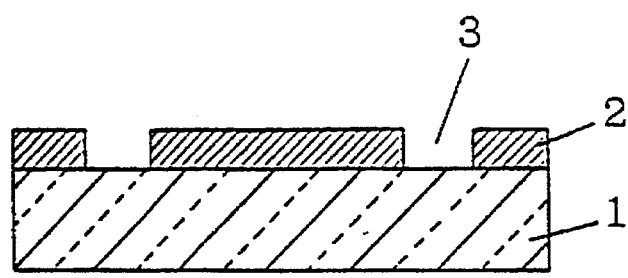
F I G. 1 2(D)
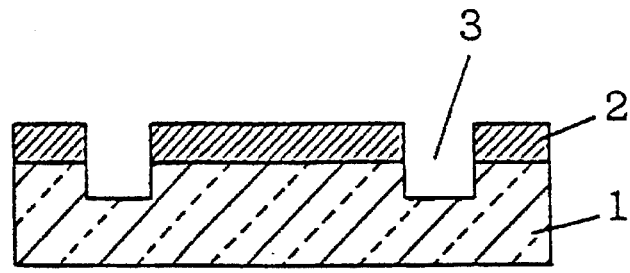
F I G. 1 2(E)
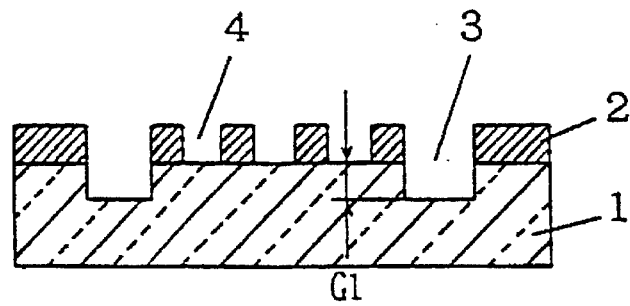

SPATIAL FILTER USED IN A REDUCTION-TYPE PROJECTION PRINTING APPARATUS

BACKGROUND OF THE INVENTION

1. Field of the Invention

The present invention relates to a reduction-type projection printing apparatus used in manufacturing, for example, a semiconductor device, a liquid crystal device, a dielectric device, a ferroelectric device, a magnetic device, and a superconductor device, and in particular, to a spatial filter used for improving resolution and depth of focus in the reduction-type projection printing apparatus.

2. Description of the Background Art

With an increase in degree of integration of a semiconductor device in recent years, implementation of a circuit having a finer pattern is required and further improvement in photolithography technique is desired. Attempts have been made to improve resolution limit R and depth of focus DOF in a reduction-type projection printing apparatus called an optical stepper which is used in photolithography. Use of light having shorter wavelength has been tried, and at the same time, associated technology for an optical lens system and a photoresist, for example, has been developed in order to improve resolution limit R of the projection printing apparatus. G-line (wavelength of 436 nm) and i-line (wavelength of 365 nm) which are bright lines of a high pressure mercury lamp, and a deep UV region (wavelength of 248 nm) included in KrF excimer laser have been used as light of short wavelength.

However, with rapid increase in degree of integration, in particular, of a semiconductor device, a line width in a circuit is desired to be at most 0.3 μm, and further, equal to or less than a light wavelength.

Resolution limit R and depth of focus DOF in the projection printing apparatus are generally given by the following Rayleigh's equations (1) and (2):

$$R = k_1 \cdot \lambda / NA \quad (1)$$

$$DOF = k_2 \cdot \lambda / (NA)^2 \quad (2)$$

where $k_1$ and $k_2$ are constants which are determined depending on a process, $\lambda$ is a light wavelength and NA is numerical aperture of the optical system.

Accordingly, it can be seen from the equation (1) that an increase in the numerical aperture NA of the optical system is necessary in order to improve resolution limit R without changing light wavelength. As can be seen from the equation (2), however, increase in the numerical aperture NA of the optical system causes reduction in depth of focus DOF which is another important characteristic in photolithography. That is, the numerical aperture NA must be optimized in order to obtain a preferred combination of resolution limit R and depth of focus DOF.

It is technically difficult to increase the numerical aperture NA, and the maximum numerical aperture NA generally achieved at present is about 0.6. In a generally used quartz-type lens material, compensation of chromatic aberration in light of short wavelength is difficult, and absorption of light by the lens material is increased, which leads to distortion of lens caused by heat resulting from the light absorption.

In recent years, some proposals have been made to improve resolution and depth of focus without the need to both reduce light wavelength $\lambda$ and increase the numerical aperture NA in the optical system.

FIG. 1 schematically shows a photomask disclosed in Japanese Patent Laying-Open No. 57-62052 (Japanese Application No. 55-136483). This photomask 1A includes a plurality of transparent portions 1a and a light-shielding pattern 2. The plurality of transparent portions 1a correspond to a plurality of lines which are arranged parallel to each other at a constant pitch. A $\lambda/2$ plate 3a which functions as a phase shifter is provided at every other transparent portion 1a. When such a photomask and coherent illumination light are used in the projection printing apparatus, phase of amplitude distribution of light passing through phase shifter 3a is reverse to that of light passing through adjacent transparent portion 1a as shown by solid curve in FIG. 1. Accordingly, in an image forming plane, light intensity distribution as shown by dotted curve in FIG. 1 can be obtained by light interference. That is, width of the light intensity distribution is smaller than that of the amplitude distribution for one projected line, resulting in improvement in resolution of a projected image.

FIG. 2 shows a cross section of a photomask disclosed in Japanese Patent Laying-Open No. (Japanese Application No. 60-206664). Photomask 1B includes a light-shielding pattern 2 formed on a transparent substrate 1. Light-shielding pattern 2 includes an isolated line-shaped aperture 5a having a width close to the resolution limit. Light-shielding pattern 2 further includes a plurality of line-shaped apertures 7 which are arranged at a constant pitch. When such a mask is used in a projection printing apparatus, intensity of light passing through the isolated aperture 5a on an image forming plane tends to be lower than that of light passing through one of the grouped apertures 7. Consequently, it is desired, for example, to increase intensity (dose) of radiation light in order to cause sufficient photochemical reaction in a resist on a semiconductor wafer by light passing through isolated aperture 5a. If dose of radiation light is increased, however, not only intensity of light passing through each of grouped apertures 7 but also width of its intensity distribution thereof is increased. Accordingly, a plurality of light-shielding dots 6a having dimension equal to or less than resolution limit are provided in each of apertures 7 in order to prevent undesired increase in intensity of light passing through each of grouped apertures 7. In addition, a phase shift layer 8 is provided in every other aperture 7 as in the photomask of FIG. 1 so as not to widen intensity distribution of light passing through each of grouped apertures 7.

FIG. 3 shows a reduction-type projection printing apparatus disclosed in Japanese Patent Laying-Open No. 4-101148 (Japanese Application No. 2-218030). The reduction-type projection printing apparatus includes a spatial filter 9, a condenser lens 10, a photomask 11 having a light-shielding pattern 12, another spatial filter 15 located at a pupil of the optical projection system 13, and a semiconductor wafer 17 located on an image forming plane. In such a projection printing apparatus, when photomask 11 has light-shielding pattern 12 including a plurality of parallel lines arranged at a constant pitch as shown in FIG. 4B, spatial filter 9 is located on a Fourier transform plane of pattern 12. As shown in FIG. 4A, spatial filter 9 includes apertures 9a and 9b which correspond to a Fourier transformed pattern of light-shielding pattern 12 shown in FIG. 4B. Pencils of rays $L_{il}$ and $L_{ir}$ of illumination light $L_i$ which pass through two apertures 9a and 9b, respectively, are diffracted by light-shielding pattern 12. Light beams $L_{l0}$ and $L_{r0}$ shown by solid lines represent zeroth-order diffracted beams of pencils of illumination light rays $L_{il}$ and $L_{ir}$, respectively, and light beams $L_{l1}$ and $L_{r1}$ shown by broken lines represent first-order diffracted beams of pencils of illumination light rays $L_{il}$ and $L_{ir}$, respectively. As shown in FIG. 4C, spatial filter 15 located at pupil 14 of the projection optical system includes a pair of apertures 15a and 15b for passing only the zeroth-order diffracted beams $L_{l0}$ and $L_{r0}$ as well as the first-order diffracted beams $L_{l1}$ and $L_{r1}$ therethrough. However, spatial filter 15 is not always necessary. In the reduction-type projection printing apparatus as shown in FIG. 3, resolution and depth of focus can be improved if there is a Fourier transform relation between the light-shielding pattern on the photomask and the pattern of apertures in the spatial filter.

As described above, resolution is effectively improved by reduction of light wavelength. However, with reduction of wavelength, a light source with a narrow wavelength band and a lens system with small aberration are required, and a photoresist suitable for light of short wavelength must be developed. At present, development of a light source which can emit light of shorter wavelength and of a high-performance lens system seems to be reaching the limit. In addition, development of new light source, lens system, photoresist and the like causes an increase in cost of lithography.

On the other hand, in a method of improving resolution and depth of focus by improving a photomask or by providing a spatial filter with a projection printing apparatus, it is possible to use an existing light source, lens system, photoresist and the like, which causes little increase in cost of lithography.

However, in a photomask of the prior art as shown in FIG. 1, resolution and depth of focus can be improved in regularly repeated pattern only. In some cases, a pattern which does not actually exist in a mask pattern could be formed on the image forming plane by phase inversion caused by a phase shifter 3a. Moreover, in a design for laying out a complex circuit pattern, since a number of phase shifters must be appropriately located, the design becomes more complex and, depending on circuit structure, inconsistency may occur in laying out phase shifters. In addition, in manufacturing a mask, the step of aligning phase shifters with high accuracy, which is not included in a conventional manufacturing process of a mask, is required, no matter whether a phase shifter is formed on or under the light-shielding pattern. Moreover, for defect inspection and correction of a photomask, a phase shifter formed of a transparent film which is completely different from a conventional light-shielding film, i.e. Cr film, must also be inspected and corrected. However, no practical method of inspecting and correcting such a transparent phase shifter has been provided so far.

In a photomask of the prior art as shown in FIG. 2, an attempt is made to improve resolution of an isolated small aperture 5a. However, there are problems with the photomask of FIG. 2 which are similar to those of the photomask in FIG. 1 since the photomask of FIG. 2 includes a phase shifter 8 similar to as the photomask of FIG. 1. In addition, stable formation of small light-shielding dots 6a is difficult, and if light-shielding dots 6a are formed large, a pattern of the large light-shielding dots might be formed on the image forming plane.

Although improvement in resolution and depth of focus can be achieved in the prior art shown in FIG. 3 simply by locating a spatial filter in the illumination system of the projection printing apparatus using a conventional normal mask with no phase shifter, the improvement depends on direction of pattern layout, which means the improvement can be achieved only in limited direction of pattern layout. For a pattern with a line width larger than a prescribed optimized line width, depth of focus (DOF) characteristic is significantly degraded from that obtained in the normal illumination. Also for a plurality of lines with the same line width, DOF characteristic depends on density of a line pattern, and DOF characteristic can not be improved independent of variation in pitch between lines. That is, in the spatial filter of the prior art as shown in FIG. 3, resolution and depth of focus can be improved only when the spatial filter has a particular geometric relation with a pattern on a photomask, and resolution and depth of focus cannot be improved for all the photomasks including various pattern sizes and layout conditions.

SUMMARY OF THE INVENTION

In view of the above-described problems of the prior art, an object of the present invention is to provide a spatial filter which can improve resolution and depth of focus in a projection printing apparatus for a mask pattern of various sizes and directions without necessitating reduction in light wavelength and improvement in the lens system, at low cost.

According to the present invention, in a reduction-type projection printing apparatus provided with an optical illumination system for illuminating a photomask with a fine pattern and the optical projection system for reduction-projecting the fine pattern onto an image forming plane, a spatial filter located near an illumination source included in the optical illumination system includes a central region through which a light beam passes at light transmittance of at a most a prescribed value, a substantially transparent peripheral region, and an optical path difference which produces phase difference of substantially 180° between light beams passing through the central region and the peripheral region.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 5A and 5A1 illustrate a schematic cross section showing an exposure apparatus projecting a relatively large pattern on a photomask by conventional normal illumination.

FIG. 5B and 5B1 illustrate a schematic cross section showing an exposure apparatus projecting a fine pattern on a photomask by conventional normal illumination.

FIG. 6B and 6B1 illustrate a schematic cross section showing an exposure apparatus projecting a relatively large pattern on a photomask by off-axis illumination of the prior art.

FIG. 7 is a plan view showing a normal annular-type spatial filter of the prior art.

FIGS. 8A and 8A1 illustrate a schematic cross section showing an exposure apparatus projecting a relatively large pattern on a photomask using a half-tone annular-type spatial filter of the prior art.

FIGS. 8B and 8B1 illustrate a schematic cross section showing an exposure apparatus projecting a fine pattern on a photomask using the half-tone annular-type spatial filter.

FIG. 9A is a graph showing amplitude distribution of light projected onto an image forming plane.

FIG. 9B is a graph showing intensity distribution of light projected onto an image forming plane.

FIGS. 12(A)–12(E) include cross sections showing a manufacturing process of the spatial filter of FIG. 11B.

FIG. 15 is a graph showing improvement in resolution in a projection printing apparatus which includes a spatial filter in accordance with the present invention.

FIG. 16A is a graph showing improvement in depth of focus for a fine pattern in a projection printing apparatus which includes a spatial filter in accordance with the present invention.

FIG. 16B is a graph showing improvement in depth of focus for a relatively large pattern in a projection printing apparatus which includes a spatial filter in accordance with the present invention.

FIG. 17A is a plan view showing a line pattern projected onto an image forming plane by conventional normal illumination.

FIG. 17B is a plan view showing a line pattern projected onto an image forming plane of a projection printing apparatus which includes a spatial filter in accordance with the present invention.

DETAILED DESCRIPTION OF THE INVENTION

Figure 1:
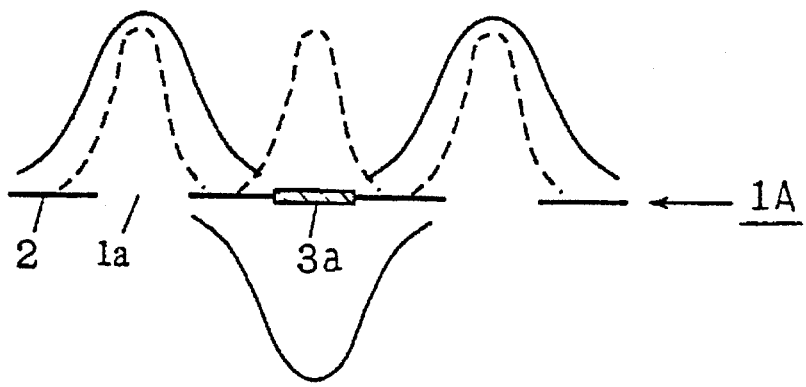
FIG. 1 is a schematic cross section showing one example of a photomask of the prior art.
Figure 2:
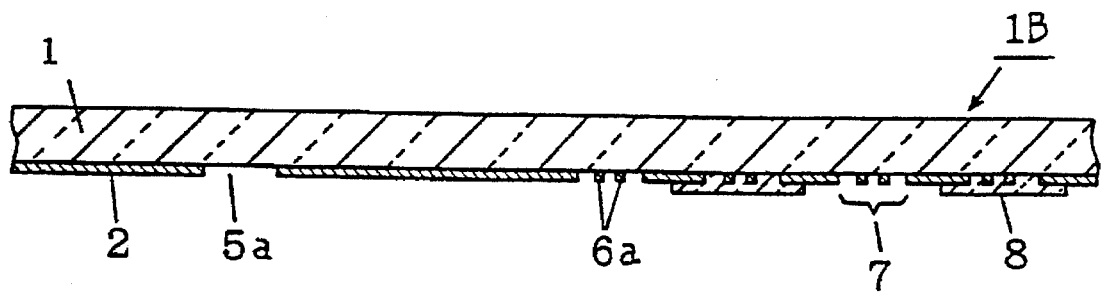
FIG. 2 is a cross section showing another example of a photomask of the prior art.

First, principles of image formation in a reduction-type projection printing apparatus will briefly be described.

Referring to FIG. 5A, projection using conventional normal illumination in the reduction-type projection printing apparatus is schematically illustrated in cross section. Illumination light passing through a condenser lens 19 is diffracted by a pattern on a photomask 20 and separated into a zeroth-order diffracted beam L0 and two ±1 order diffracted beams L1. In this case, photomask 20 has a relatively large pattern as can been seen in a circle 20A of FIG. 5A1 which shows a region of a circle 20a enlarged. Accordingly, diffraction angles formed by diffracted beams L0 and L1 are not significantly large, and all of three diffracted beams enter a pupil of a projection lens system 21. Then, the pattern on mask 20 is reduction-projected onto an image forming plane such as a semiconductor wafer 22 by those three beams.

However, as can been seen in a circle 20B of FIG. 5B1 which shows a region of a circle 20b enlarged in FIG. 5B, when photomask 20 has a fine pattern, diffraction angles formed by zeroth-order diffracted beam L0 and first order diffracted beams L1 are large. If the diffraction angles are large, first order diffracted beams L1 cannot enter the pupil of projection lens system 21, and imaging of a fine pattern on semiconductor wafer 22 is impossible.

Figure 3:
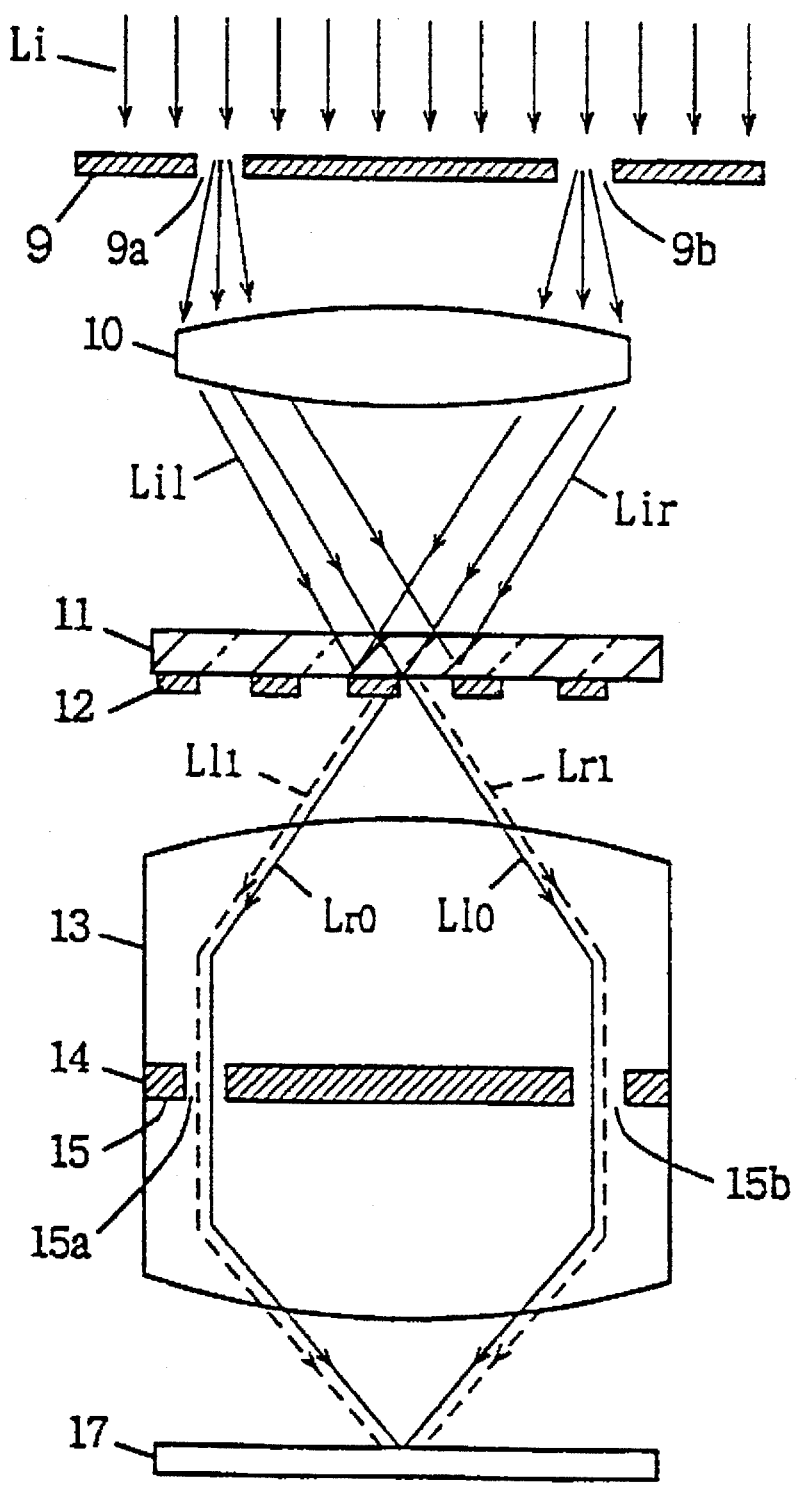
FIG. 3 is a schematic cross section showing a reduction-type projection printing apparatus of the prior art.
Figure 4A:
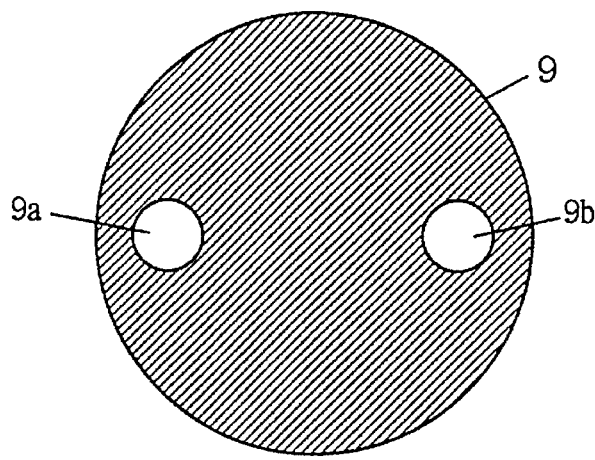
FIG. 4A is a plan view showing a spatial filter used in the reduction-type projection printing apparatus of FIG. 3.
Figure 4B:
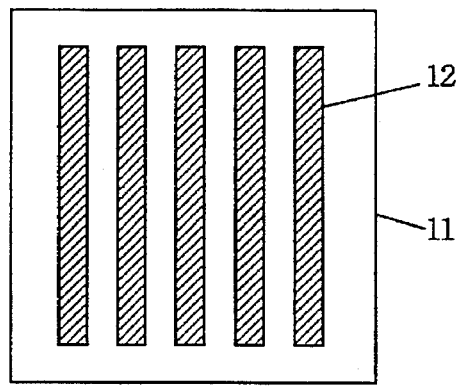
FIG. 4B is a plan view showing a photomask used in the reduction-type projection printing apparatus of FIG. 3.
Figure 4C:
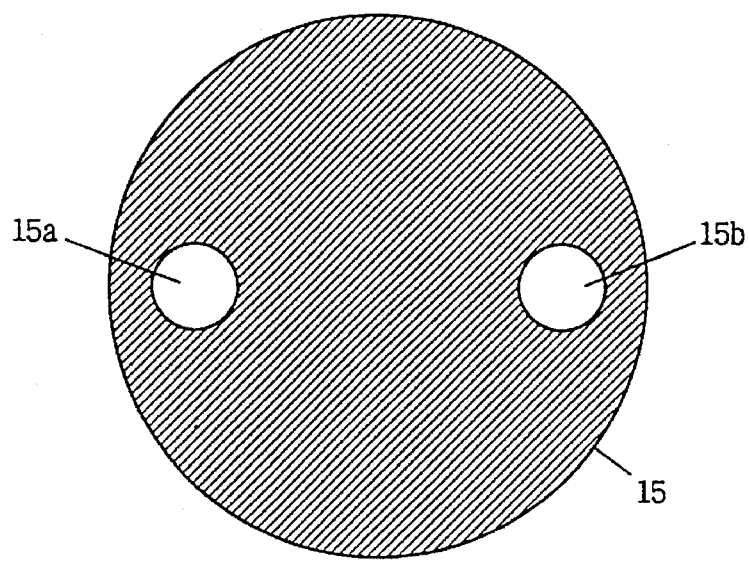
FIG. 4C is a plan view showing another spatial filter used in the reduction-type projection printing apparatus of FIG. 3.
Figure 6B:
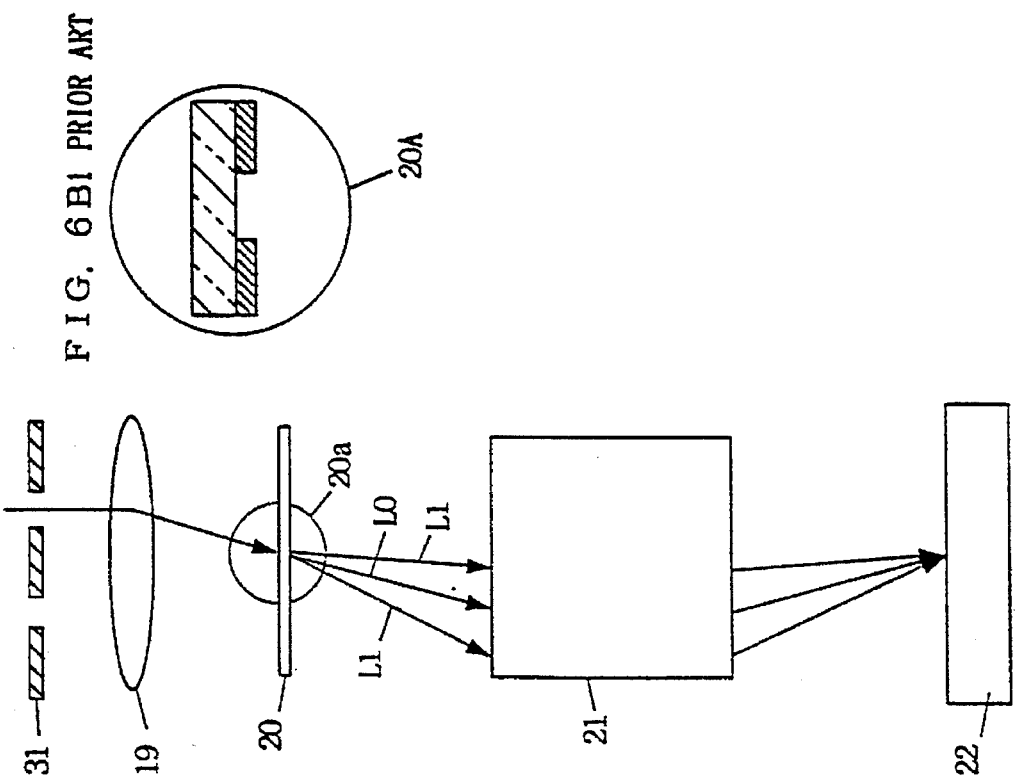
Figure 6A:
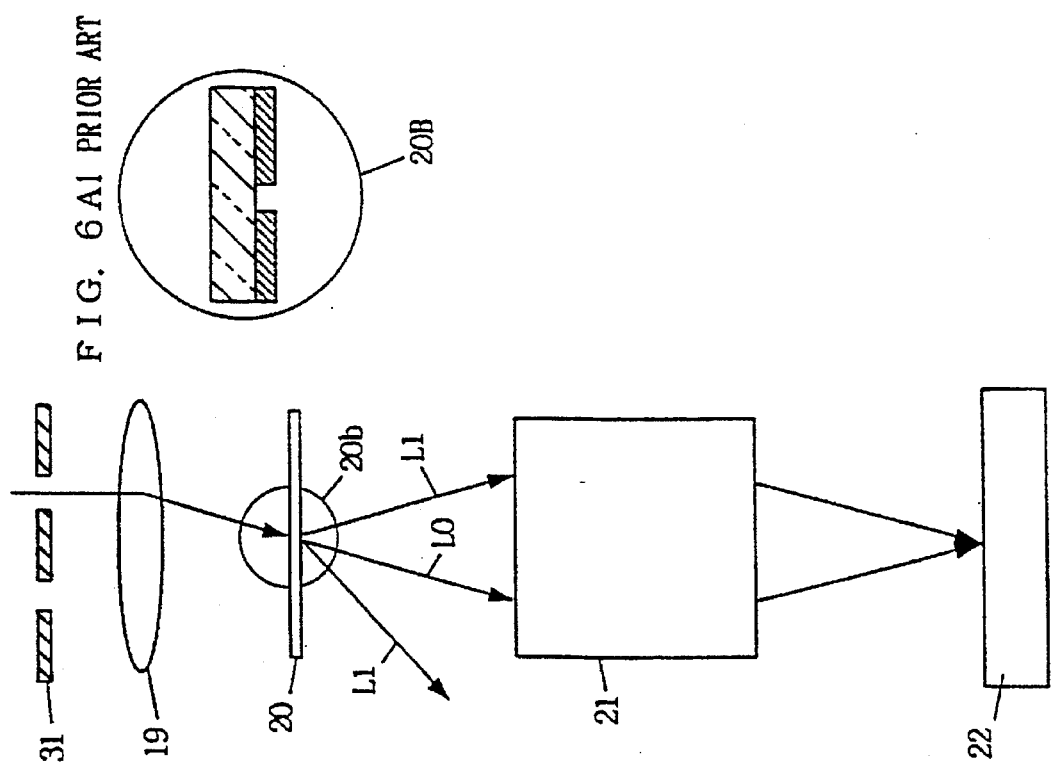
FIG. 6A is a schematic cross section showing an exposure apparatus projecting a fine pattern on a photomask by off-axis illumination of the prior art.

In order to solve this problem, an off-axis illumination method as shown in FIG. 6A has been proposed in the prior art. A projection printing apparatus of the prior art in FIG. 3 uses such off-axis illumination. That is, in FIG. 6A, a spatial filter 31 similar to that shown in FIG. 4A is located above a condenser lens 19. A pencil of rays which passes through an aperture in spatial filter 31 obliquely enters photomask 20 through condenser lens 19. Accordingly, when photomask 20 has a fine pattern as shown in circle 20B of FIG. 6A1 and a diffraction angle is large, even if one of the pair of first order diffracted beams L1 cannot enter the pupil of projection lens system 21, two beams, i.e., the other of first-order diffracted beams L1 and zeroth-order diffracted beam L0 can enter the pupil. Thus, the fine pattern on mask 20 can be imaged on semiconductor wafer 22. At this time, improvement in degree of phase matching can be achieved by almost completely eliminating optical path difference between two beams which enter the pupil, resulting in improvement in resolution and depth of focus. On the other hand, in imaging by three beams as shown in FIG. 5A, phases are matched to one another only under just focused conditions, resulting in insufficient depth of focus.

In the off-axis illumination as shown in FIG. 6A, improvement in resolution and depth of focus can be achieved independent of direction of pattern layout by using an annular-type spatial filter such as shown in FIG. 7 instead of a spatial filter such as shown in FIG. 4A.

In such an off-axis illumination, however, for a pattern with a size over the range of optimized pattern size, DOF characteristic is significantly reduced compared to that obtained in normal illumination as shown in FIG. 5A, and DOF characteristic is remarkably decreased if there is a variation in pattern density.

For example, as shown in a circle 20A in FIG. 6B1, when pattern size is increased and diffraction angle is reduced, both of the pair of first order diffracted beams L1 can enter the pupil of the projection lens system, and a pattern on mask 20 is projected onto semiconductor wafer 22 by three diffracted beams. In the imaging by three beams of the off-axis illumination as shown in FIG. 6B, phase deviation between beams is larger than that in the imaging by three beams of the on-axis illumination as shown in FIG. 5A. Accordingly, DOF characteristic obtained in the imaging by three beams of the off-axis illumination as shown in FIG. 6B is inferior to that obtained in the imaging by three beams of a normal on-axis illumination such as shown in FIG. 5A.

FIG. 8A illustrates a method of preventing such degradation in DOF characteristic. In FIG. 8A, a half-tone annular-type spatial filter 32 is located above a condenser lens 19 and a central region 32A thereof has prescribed light transmittance. As shown by a dashed arrow, imaging similar to that obtained by the normal illumination shown in FIG. 5A is carried out by the on-axis illumination using light passing through central region 32A. That is, degradation of DOF characteristic can be suppressed with respect to that of the normal illumination by placing a balanced image formed by three-beams of an on-axis illumination component having reduced light intensity over an image formed by three beams of off-axis illumination.

However, when a pattern size is small as shown in a circle 20B in FIG. 8B1, an image formed by three beams of on-axis illumination having reduced light intensity comes to be placed over an image formed by two beams of off-axis illumination. At this time, as can be seen from a graph of FIG. 9A showing amplitude distribution 23, width of the main peak of amplitude distribution for two beams of off-axis illumination is relatively small, while that of the main peak of amplitude distribution 24 for three beams of on-axis illumination having a reduced light intensity is large.

In a graph of FIG. 9B showing intensity distribution, a curve 26 is intensity distribution obtained by adding amplitude distribution 23 to 24 of FIG. 9A. Since amplitude distributions 23 and 24 have phases of the same sign, width of the main peak of intensity distribution 26 obtained by adding one amplitude distribution to the other is larger than that of the main peak of amplitude distribution 23.

That is, for a mask with a small pattern size, in a projection method in which the image formed by three beams of on-axis illumination having reduced intensity is placed over the image formed by two beams of off-axis illumination, both resolution and depth of focus characteristic will be inferior to those obtained in a projection method using two beams of off-axis illumination as shown in FIG. 6A.

The present invention provides a spatial filter which can improve resolution and DOF characteristic in a reduction-type projection printing apparatus independent of direction, size and density of a pattern. The spatial filter in accordance with the present invention is an annular-type with prescribed transmittance at the central region thereof, and includes means for producing phase difference of 180° between light beams passing through the central region and the peripheral region thereof.

Figure 10:
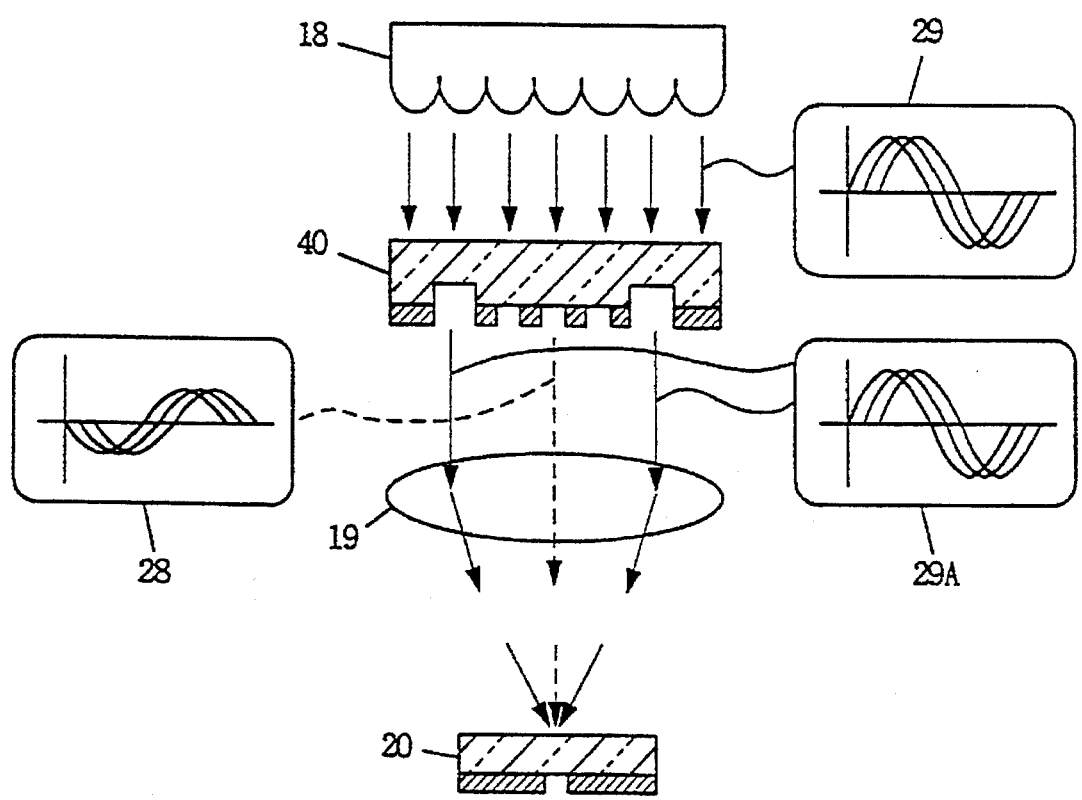
FIG. 10 is a schematic cross section showing an illumination system of a projection printing apparatus with a spatial filter in accordance with the present invention.

Effects of the special filter of the present invention will now be described with reference to FIG. 10 along with FIGS. 9A and 9B. FIG. 10 is a schematic cross section showing the optical illumination system of a projection printing apparatus. Basically, light emitted from a light source (not shown) is partially coherent light after it passes through a fly-eye lens 18. That is, as shown in a graph 29 of amplitude phase in FIG. 10, there is not a large phase difference among beams passing through respective microlenses. Therefore, phase adjustment can be carried out by a novel phase/transmittance modulation filter 40 in accordance with the present invention. As can be seen from comparison between graphs of amplitude phase 28 and 29A in FIG. 10, phase of light passing through the central region of phase/transmittance modulation filter 40 can be shifted by 180° with respect to that of light passing through the peripheral region thereof. Light passing through spatial filter 40 is specially modulated to an on-axis component and an off-axis component by a condenser lens 19, and those light components are directed onto a mask 20 with phase difference maintained at 180°.

When a fine pattern on mask 20 is projected onto an image forming plane in an exposure apparatus having the illumination system such as shown in FIG. 10, an image formed by three beams of on-axis illumination is placed over an image formed by two beams of off-axis illumination as in the case of FIG. 8B. In the illumination of FIG. 10, however, as can be seen in the graph of FIG. 9A, an image formed by two beams of off-axis illumination has amplitude distribution of positive phase as shown by curve 23, while an image formed by three beams of on-axis illumination has amplitude distribution of negative phase as shown by curve 25. Accordingly, side lobes in the distribution are offset by these two amplitude distributions 23 and 25 of opposite phase, resulting in such light intensity distribution as shown by a curve 27 in FIG. 9B. As can be seen from comparison between curves 26 and 27, in the illumination using the spatial filter of the present invention shown in FIG. 10, width of light intensity distribution is significantly reduced compared to that in the illumination of the prior art shown in FIG. 8B, although light intensity of a projected pattern is slightly decreased. In other words, in projection printing using the spatial filter of the present invention such as shown in FIG. 10, resolution and depth of focus can be improved over projection printing using a spatial filter of the prior art as shown in FIG. 8B.

As described above, resolution and DOF characteristic can be improved by a phase/transmittance modulation spatial filter of the present invention independent of direction, size and density of a mask pattern being used.

Quartz, for example, can be used as a substrate of the spatial filter of the present invention. Inner and outer diameters of an annular aperture in the spatial filter will be represented by σ factor, which is defined as $\sigma=NA_i/NA_p$, where $NA_i$ is the numerical aperture of the illumination system and $NA_p$ is the numerical aperture of the projection system. When a projection printing apparatus is used, the numerical aperture $NA_p$ of the projection system is generally set to a fixed maximum value, while the numerical aperture $NA_i$ of the illumination system varies depending on size of a stop located in the illumination system. In the spatial filter of the present invention, inner and outer diameters of the annular aperture can be set to a value corresponding to $\sigma_2$ in the range from 0.2 to 0.6 and $\sigma_1$ in the range from 0.4 to 0.7, respectively.

Transmittance modulation of the central region of the spatial filter can be realized by provision of a plurality of small apertures with a light-shielding film of the central region or use of semi-transparent film made of, for example, Cr, Al, Ta, or Mo having a thickness of at most about 150 nm. In addition, optical path difference which produces relative phase difference of 180° between pencils of rays passing through the central portion and the peripheral portion of the spatial filter can be obtained by changing a thickness of a filter substrate by etching. Such an optical path difference can be obtained also by providing an additional layer having a prescribed thickness, such as an SOG (spin-on-glass) film, a sputtered $SiO_2$ film or an organic film. An amount of change t in a substrate thickness or a thickness t of the additional layer can be obtained by the following equations (3a) or (3b):

$$n \cdot t - t = m \cdot \lambda/2 \tag{3a}$$

$$t = m \cdot \lambda/2(n-1) \tag{3b}$$

where n is a refractive index of the filter substrate or stacked material, and m is a positive odd number.

DESCRIPTION OF THE PREFERRED EMBODIMENTS

Figure 11A:
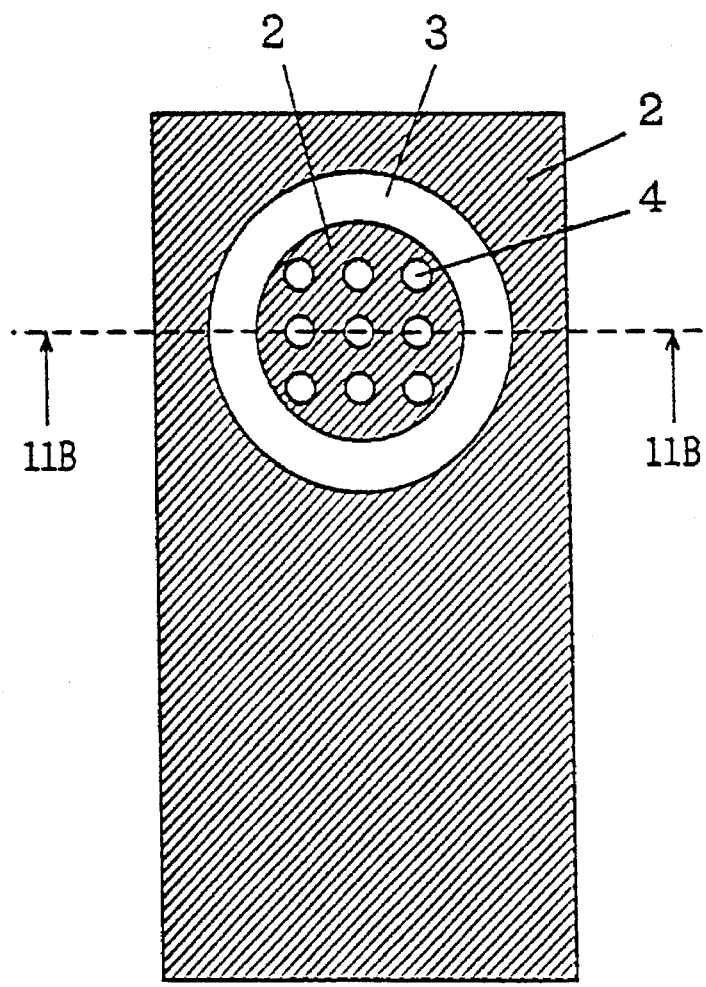
FIG. 11A is a schematic plan view showing a spatial filter in accordance with a first embodiment of the present invention.
Figure 11B:
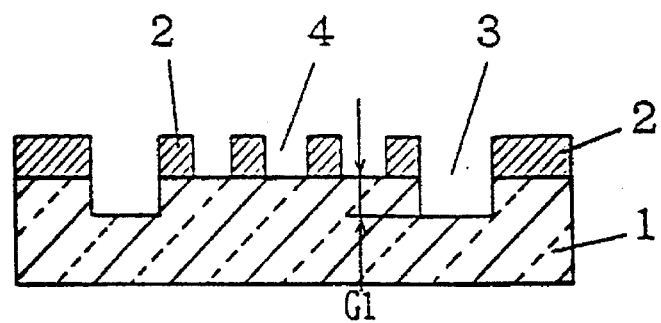
FIG. 11B is a cross section taken along line 11B—11B in FIG. 11A.

FIG. 11A is a schematic plan view of a spatial filter in accordance with a first embodiment of the present invention, and FIG. 11B is a cross section taken along line 11B—11B in FIG. 11A. In the spatial filter of the first embodiment, a light-shielding pattern 2 is formed on a quartz substrate 1. Light-shielding pattern 2 includes an annular aperture 3 and a plurality of small apertures 4 located in the central region thereof. Substrate 1 has its thickness reduced under a region of annular aperture 3 by etching. An amount of change in thickness of the substrate G1, i.e. an amount of the reduction in thickness of the substrate, is determined by the above equation (3b). When substrate 1 is made of quartz and a KrF excimer laser (k=248 nm) is used as exposure light, the amount of change in thickness of the substrate G1 is set to 70 nm. Although substrate 1 is etched under the region of annular aperture 3 in FIG. 11B, it goes without saying that it may alternatively be etched under the plurality of small apertures 4 in the central region.

FIG. 12 illustrates a manufacturing process of the spatial filter shown in FIG. 11B. First, quartz substrate 1 is prepared in FIG. 12(A), and a light-shielding film 2 made of an Al layer with a thickness of about 400 nm is formed on substrate 1 in FIG. 12(B). Then, in FIG. 12(C), Al layer 2 is patterned by normal photolithography and annular aperture 3 is formed. In FIG. 12(D), substrate 1 is etched under the region of annular aperture 3 by dry process such as RIE (reaction ion etching) or wet process using, for example, HF. In FIG. 12(E), Al layer 2 is again patterned by normal photolithography, and a plurality of small apertures 4 are formed in the central region inside annular aperture 3. Thus, a phase/transmittance modulation filter shown in FIGS. 11A and 11B is completed.

Figure 13A:
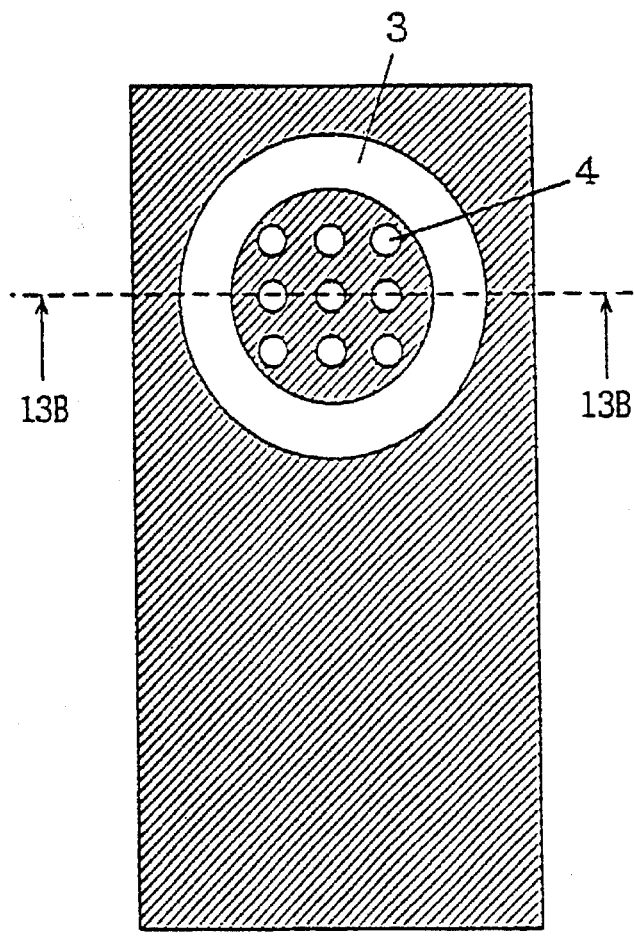
FIG. 13A is a plan view showing a spatial filter in accordance with a second embodiment of the present invention.
Figure 13B:
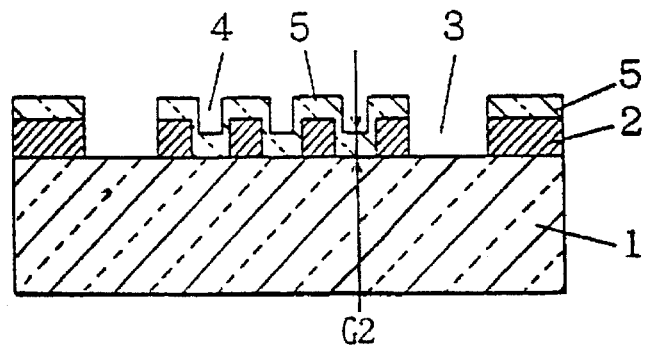
FIG. 13B is a cross section taken along line 13B—13B in FIG. 13A.
Figure 14A:
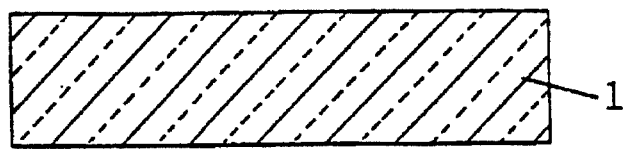
FIGS. 14(A)–14(E) include cross sections showing a manufacturing process of the spatial filter of FIG. 13B.
Figure 14B:
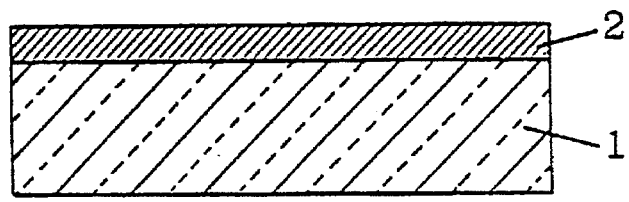
Figure 14C:
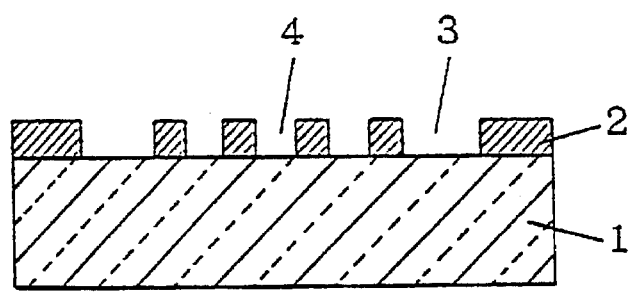
Figure 14D:
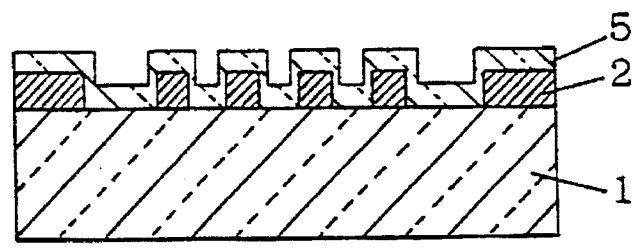
Figure 14E:
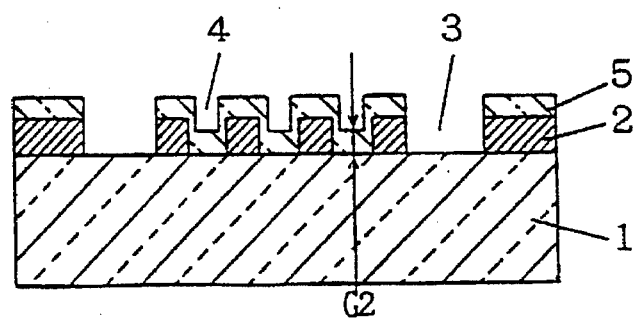

FIG. 13A is a plan view of a spatial filter in accordance with a second embodiment of the present invention, and FIG. 13B is a cross section taken along line 13B—13B of FIG. 13A. In the spatial filter of the second embodiment, a light-shielding pattern 2 is formed on a transparent substrate 1. Light-shielding pattern 2 includes an annular aperture 3 and a plurality of small apertures 4 located in the central region thereof. The plurality of small apertures 4 are covered with a film of transparent material 5. Film of transparent material 5 has a thickness G2 which causes phase shifting of light used in a projection printing apparatus by 180°. The thickness G2 also is obtained by the above equation (3b).

FIG. 14 illustrates a manufacturing process of a spatial filter shown in FIG. 13B. In FIG. 14(A), a quartz substrate 1 is prepared, and in FIG. 14(B), a light-shielding film 2 made of an Al layer having a thickness of about 400 nm is formed on quartz substrate 1. In FIG. 14(C), Al layer 2 is patterned by normal photolithography, and an annular aperture 3 and a plurality of small apertures 4 are formed. In FIG. 14(D), substrate 1 and light-shielding pattern 2 are covered with a layer of transparent material 5. Transparent material layer 5 can be formed, for example, of SOG, $SiO_2$, or organic material. In FIG. 14(E), transparent material 5 which is located at annular aperture 3 is patterned and removed. Thus, a phase/transmittance modulation filter as shown in FIGS. 13A and 13B is completed.

Although small apertures 4 are shown having a circular shape in the first and second embodiments, it goes without saying that they may have triangular or other polyangular shape. Moreover, a thickness of light-shielding Al layer 2 is not limited to 400 nm, it only needs to be at least about 150 nm.

When a phase/transmittance modulation spatial filter as shown in the first and second embodiments is used in a projection printing apparatus, small apertures 4 in the central region and annular aperture 3 in the peripheral region of the spatial filter are positioned so that they correspond to the cycle of arrangement of a plurality of microlenses in a fly-eye lens 18 (see FIG. 10). That is, it is desired for each of corresponding microlens to be wholly included in each of apertures 4 and 3.

In a graph of FIG. 15, resolution in the projection printing apparatus which can be achieved by a novel phase/transmittance modulation filter in accordance with the first and second embodiments is shown in comparison with that in the prior art. In this graph, the abscissa indicates a designed line width (μm) on an image forming plane and the ordinate indicates an actually measured line width (μm) on the image forming plane. A circle corresponds to a novel spatial filter in accordance with the present invention, a triangle to a normal annular-type spatial filter of the prior art as shown in FIG. 7, a square to an annular-type spatial filter with its central region being semi-transparent, a rhombus to normal illumination as shown in FIG. 5A. In the measurement of FIG. 15, the numerical aperture NA of the projection system in the projection printing apparatus is 0.45, and a KrF excimer laser with a wavelength λ of 248 nm was used. $\sigma_1$ and $\sigma_2$ were set to 0.5 and 0.4, respectively, for all of the annular-type spatial filters. Chemically amplified negative resist was used as a resist layer on a semiconductor wafer. In addition, light transmittance in the central region of the spatial filter of the present invention was set to 15%.

As can be seen from FIG. 15, among the prior art, the normal annular-type spatial filter achieves the highest resolution limit of 0.28 μm, while the novel phase/transmittance modulation spatial filter of the present invention achieves superior resolution limit of 0.25 μm or smaller. That is, it will be understood from the graph of FIG. 15 that the novel spatial filter of the present invention can achieve higher resolution limit than spatial filters of any type in the prior art.

In FIGS. 16A and 16B, DOF characteristic of the spatial filter in accordance with the first and second embodiments are shown in comparison with that of various spatial filters in the prior art. In each graph, the abscissa indicates an amount of defocus (μm) and the ordinate indicates a line width measured on an image forming plane. Experimental conditions in FIGS. 16A and 16B were the same as those in FIG. 15.

As can be seen from FIG. 16A, for projection of a line with a small width of 0.3 μm, the best DOF characteristic in the prior art is achieved by the normal annular-type spatial filter, and DOF characteristic which can be achieved by a novel spatial filter in accordance with the present invention is comparable to the best one achieved in the prior art. As can be seen from FIG. 16B, however, for projection of a line with a relatively large width of 0.7 μm, DOF characteristic of the annular-type spatial filter in the prior art is apparently degraded, while DOF characteristic of the novel spatial filter of the present invention is equal to that of the conventional normal illumination. As can be seen from FIG. 16A, however, for projection of a line with a width of 0.3 μm, DOF characteristic of the conventional normal illumination is remarkably degraded. Consequently, it will be understood that the phase-transmittance modulation filter in accordance with the present invention can achieve superior DOF characteristic independent of a width of a projected line.

FIGS. 17A and 17B are tracings of scanning electron micrographs of a line pattern which is actually formed in a resist layer on a semiconductor wafer. The conventional normal illumination is used in FIG. 17A and the phase/transmittance modulation filter of the present invention is used in FIG. 17B. In FIGS. 17A and 17B, a designed line width is 0.3 μm and line pitch is set to be 0.6 μm and 1.2 μm. It can been seen from FIG. 17A of the normal illumination that width of a projected line becomes large where line pitch is large. On the other hand, it will be understood from FIG. 17B that width of a projected line is substantially constant independent of line pitch. That is, it will be understood that the novel spatial filter of the present invention can improve resolution independent of pattern density.

Figure 18A:
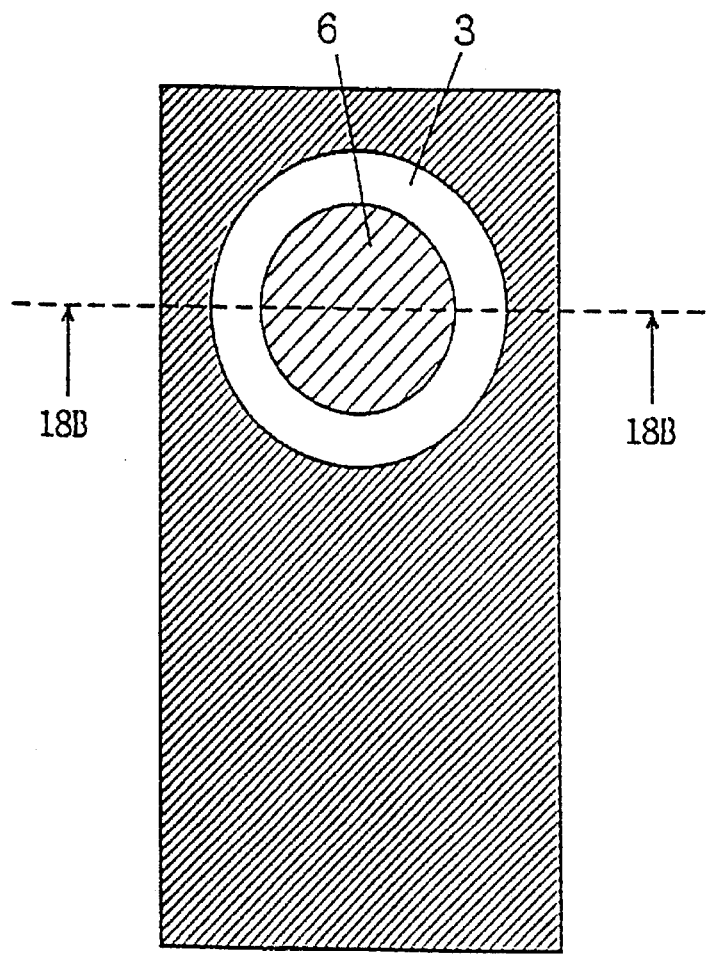
FIG. 18A is a plan view showing a spatial filter in accordance with a third embodiment of the present invention.
Figure 18B:
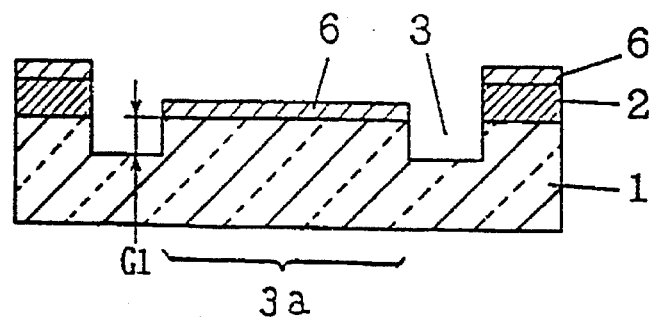
FIG. 18B is a cross section taken along line 18B—18B of FIG. 18A.
Figure 19A:
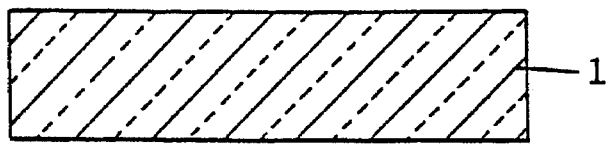
FIGS. 19(A)–19(G) include cross sections showing a manufacturing process of the spatial filter of FIG. 18B.
Figure 19B:
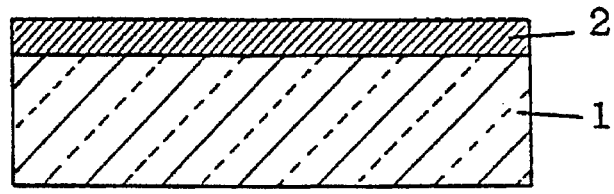
Figure 19C:
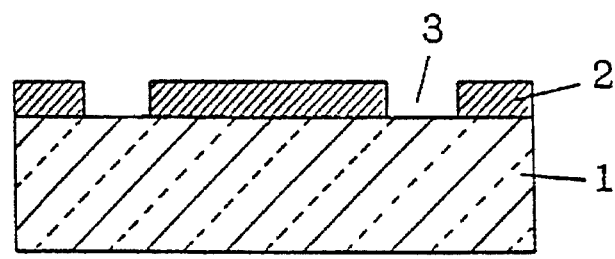
Figure 19D:
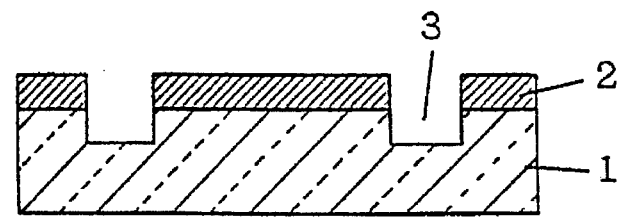
Figure 19E:
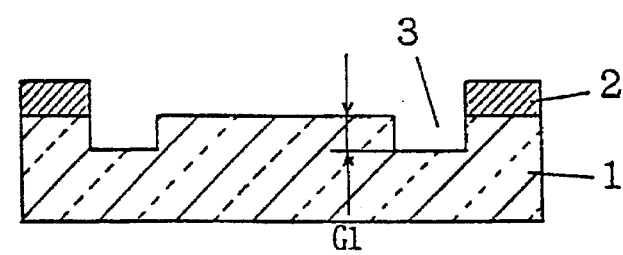
Figure 19F:
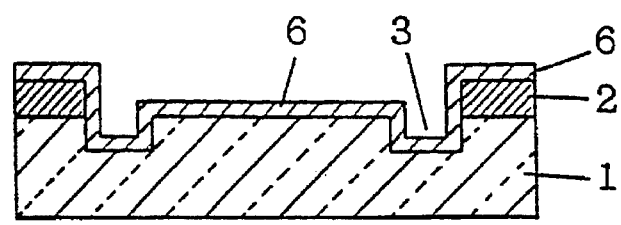
Figure 19G:
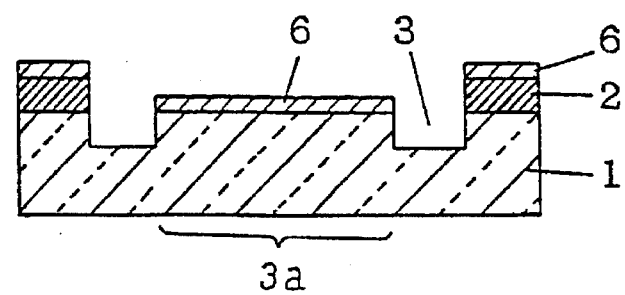

FIG. 18A is a plan view showing a phase-transmittance modulation filter in accordance with a third embodiment of the present invention, and FIG. 18B is a cross section taken along line 18B—18B of FIG. 18A. In the spatial filter in accordance with the third embodiment, a light-shielding film 2 is formed on a transparent substrate 1. Light-shielding film 2 includes an annular aperture 3 and a central aperture 3a integrated with annular aperture 3. In central aperture 3a, a semi-transparent film 6 is formed on substrate 1. Thickness of substrate 1 is reduced under annular aperture 3 by etching. That is, thickness of substrate 1 is varied by an amount of change G1 so that phase difference of 180° is produced between light passing through annular aperture region 3 and light passing through central region 6.

FIG. 19 illustrates a manufacturing process of the spatial filter shown in FIG. 18B. In FIG. 19(A), a quartz substrate 1 is prepared, and in FIG. 19(B), a light-shielding film 2 made of an Al layer with a thickness of about 400 nm is formed on quartz substrate 1. In FIG. 19(C), light-shielding film 2 is patterned and an annular aperture 3 is formed. In FIG. 19(D), substrate 1 is etched under annular aperture region 3 as in the first embodiment. In FIG. 19(E), light-shielding film 2 on the central region which is surrounded by annular aperture 3 is removed. In FIG. 19(F), substrate 1 and light-shielding film 2 are covered with a semi-transparent film 6 formed of a Cr layer having a thickness of about 70 nm. In FIG. 19(G), semi-transparent film 6 at annular aperture region 3 is removed, and a spatial filter of phase/transmittance modulation type as shown in FIGS. 18A and 18B is completed. Thickness of Cr film 6 is not limited to 70 nm, and it may have any thickness up to about 150 nm. It will be understood that resolution and depth of focus characteristic in the projecting printing apparatus can be improved by a novel spatial filter as shown in the third embodiment as well as spatial filters shown in the first and second embodiments.

Figure 20:
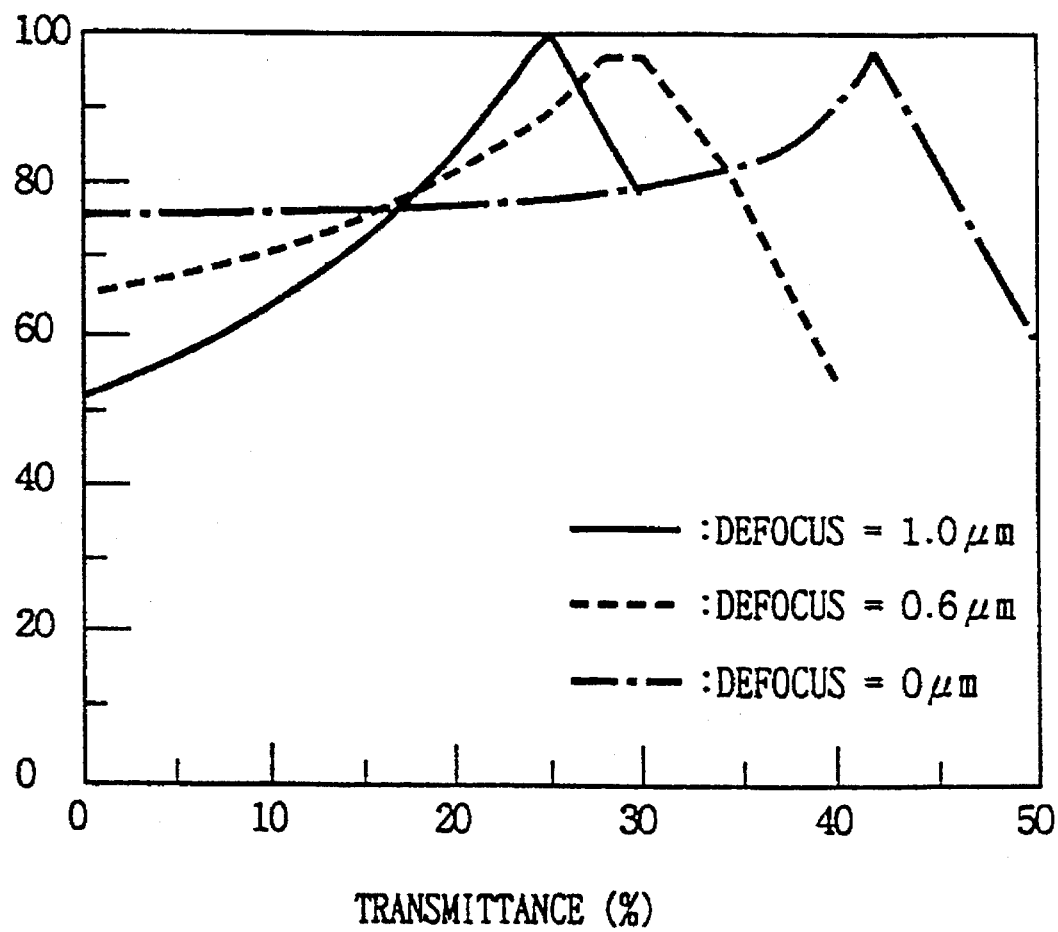
FIG. 20 is a graph showing a relationship between transmittance at the central portion of a spatial filter in accordance with the present invention and contrast of an image formed on an image forming plane.

FIG. 20 is a graph showing a result obtained by simulation of the relationship between transmittance at the central region surrounded by annular aperture 3 of the spatial filter of the present invention and normalized contrast on an image forming plane. That is, in this graph, the abscissa indicates transmittance at the central region surrounded by annular aperture 3 and the ordinate indicates normalized contrast (%) in a pattern of 0.25 μm line and space projected onto the image forming plane. In this graph, the solid curve corresponds to an amount of defocus of 1.0 μm, the broken curve to an amount of defocus of 0.6 μm, and the curve of chain dotted line to an amount of defocus of 0 μm. It will be understood from FIG. 20 that transmittance at the central region surrounded by annular aperture 3 is desired to be at most 45% in the phase/transmittance modulation type spatial filter in accordance with the present invention.

Although a light-shielding film formed of Al and a semi-transparent film formed of Cr have been described in the above embodiments, these light-shielding film and semi-transparent film may be formed of material such as Al, Cr, Ta, or Mo if thickness thereof is appropriately selected.

In addition, although the above embodiments have been described for illumination light of a KrF excimer laser having a wavelength λ of 248 nm, it goes without saying that a novel spatial filter in accordance with the present invention is effective for illumination light such as a g-line having a wavelength λ of 436 nm, an i-line having a wavelength λ of 365 nm, or an ArF excimer laser having a wavelength λ of 193 nm.

As described above, it will be understood that a spatial filter of phase-transmittance modulation type in accordance with the present invention can improve resolution and DOF characteristic in an existing projection printing apparatus at low cost independent of direction, size and density of a pattern to be projected.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a reduction-type projection printing apparatus provided with an optical illumination system for illuminating a photomask with a fine pattern of light and an optical projection system for reduction-projecting the fine pattern of light passed through the photomask onto an image forming plane, a spatial filter located near an illumination source which is included in said optical illumination system for passing the fine pattern of light to the photomask, the spatial filter comprising:

a central region through which light beams from the illumination source pass at a transmittance of at most a prescribed value;

a peripheral region surrounding said central region and being substantially transparent for passing light beams from the illumination source; and means for producing a phase difference of substantially 180° between the light beams passing through said central region and the light beams passing through said peripheral region, said central region comprising a light-shielding layer with a plurality of small apertures formed therethrough for passing the light beams from the illumination source, said central region having a transmittance of at most 45%.

2. The spatial filter according to claim 1, wherein said means for producing a phase difference comprises a substantially transparent additional layer of a prescribed thickness formed on said central region.

3. The spatial filter of claim 1, wherein said optical illumination system includes a fly-eye lens having a plurality of microlenses for passing the light beams from the illumination source to the spatial filter, a total number of said plurality of small apertures being determined based on the transmittance, a periodicity of said plurality of small apertures being coincident with a periodicity of said plurality of microlenses of said fly-eye lens.

4. The spatial filter according to claim 1, wherein said central region and said peripheral region are formed on a substantially transparent substrate, a thickness of a portion of said substantially transparent substrate corresponding to said central region along a direction in which the light beams pass being different than a thickness of a portion of said substantially transparent substrate corresponding to said peripheral region along the direction in which the light beams pass to provide the phase difference.

5. The spatial filter according to claim 4, wherein the thickness of the portion of said substantially transparent substrate corresponding to said central portion is greater than the thickness of the portion of said substantially transparent substrate corresponding to said peripheral region.

6. A reduction-type projection printing apparatus comprising:

illumination means for emitting light;

a spatial filter for passing the emitted light as a fine pattern of light to a photomask, said spatial filter comprising
 a central region having at least a predetermined transmittance value for passing light beams from said illumination means, and
 a peripheral region surrounding said central region and being substantially transparent for passing light beams from said illumination means, said central region and said peripheral region of said spatial filter being formed on a substantially transparent substrate, a thickness of a portion of said substantially transparent substrate corresponding to said central region along a direction in which the light beams pass being different than a thickness of a portion of said substantially transparent substrate corresponding to said peripheral region along the direction in which the light beams pass to provide a phase difference of substantially 180 degrees between the light beams passing through said central region and the light beams passing through said peripheral region; and optical projection means for reduction-projecting the fine pattern of light passed through said photomask to an image forming plane.

7. The reduction-type projection printing apparatus of claim 6, wherein said central region of said spatial filter comprises a uniform semi-transparent layer for passing the light beams from said illumination means at the predetermined transmittance value.

8. The reduction-type projection printing apparatus of claim 7, wherein the predetermined transmittance value is 45% at most.

9. The reduction-type projection printing apparatus of claim 6, wherein the thickness of said substantially transparent substrate corresponding to said central region is greater than the thickness of the portion of said substantially transparent substrate corresponding to said peripheral region.

10. The reduction-type projection printing apparatus of claim 6, wherein said central region of said spatial filter comprises a light shielding layer having a plurality of small apertures formed therethrough for passing the light beams from said illumination means at the predetermined transmittance value.

11. The reduction-type projection printing apparatus of claim 6, wherein the predetermined transmittance value of said central region is 45% at most.

12. In a reduction-type projection printing apparatus provided with an optical illumination system for illuminating a photomask with a fine pattern of light and an optical projection system for reduction-projecting the fine pattern of light passed through the photomask onto an image forming plane, a spatial filter located near an illumination source which is included in said optical illumination system for passing the fine pattern of light to the photomask, the spatial filter comprising:

a central region through which light beams from the illumination source pass at a transmittance of at most a prescribed value;

a peripheral region surrounding said central region and being substantially transparent for passing light beams from the illumination source; and means for producing a phase difference of substantially 180° between the light beams passing through said central region and the light beams passing through said peripheral region, the spatial filter being formed on a substantially transparent substrate wherein said means for producing a phase difference of substantially 180° comprises a portion of said substantially transparent substrate corresponding to said central region having a thickness along a direction in which the light beams pass which is greater than a thickness of a portion of said substantially transparent substrate corresponding to said peripheral region along the direction in which the light beams pass.

* * * * *